(12) United States Patent
Burggraf

(10) Patent No.: US 12,103,787 B2
(45) Date of Patent: Oct. 1, 2024

(54) METHOD AND DEVICE FOR TRANSFERRING COMPONENTS

(71) Applicant: EV Group E. Thallner GmbH, St. Florian am Inn (AT)

(72) Inventor: Jurgen Burggraf, Scharding (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 162 days.

(21) Appl. No.: 17/795,002

(22) PCT Filed: Feb. 18, 2020

(86) PCT No.: PCT/EP2020/054252
§ 371 (c)(1),
(2) Date: Jul. 25, 2022

(87) PCT Pub. No.: WO2021/164855
PCT Pub. Date: Aug. 26, 2021

(65) Prior Publication Data
US 2023/0062106 A1  Mar. 2, 2023

(51) Int. Cl.
H01L 21/68 (2006.01)
B65G 47/52 (2006.01)
H05K 13/02 (2006.01)

(52) U.S. Cl.
CPC ................... B65G 47/52 (2013.01)

(58) Field of Classification Search
CPC ......... B65G 47/52; H05K 13/02; H01L 21/68
USPC .......... 198/370.01; 156/230, 272.2
See application file for complete search history.

(56) References Cited

U.S. PATENT DOCUMENTS

| 5,739,800 A | * | 4/1998 | Lebby | H04N 23/55 345/82 |
| 6,277,711 B1 | * | 8/2001 | Wu | H01L 24/83 438/464 |
| 6,559,905 B1 | * | 5/2003 | Akiyama | H01L 27/1266 257/E21.414 |
| 6,649,012 B2 | * | 11/2003 | Masayuki | H01L 24/75 428/323 |
| 7,195,687 B2 | * | 3/2007 | Hayashi | H01L 24/18 438/66 |

(Continued)

FOREIGN PATENT DOCUMENTS

DE  10 2016 221 533 A1  5/2018
JP  2002-314052 A  10/2002

(Continued)

OTHER PUBLICATIONS

International Search Report from corresponding International Patent Application No. PCT/EP2020/054252, dated Nov. 9, 2020.

(Continued)

*Primary Examiner* — Douglas A Hess
(74) *Attorney, Agent, or Firm* — KUSNER & JAFFE

(57) ABSTRACT

A method for the transfer of components from a sender substrate to a receiver substrate includes provision and/or production of the components on the sender substrate, transfer of the components of the sender substrate to the transfer substrate, and transfer of the components from the transfer substrate to the receiver substrate. The components can be transferred selectively by means of bonding means and/or debonding means.

13 Claims, 3 Drawing Sheets

(56) References Cited

U.S. PATENT DOCUMENTS

| | | | |
|---|---|---|---|
| 8,300,007 B2 * | 10/2012 | Hillis | G09F 9/30 345/76 |
| 9,202,993 B2 | 12/2015 | Uhrmann et al. | |
| 9,493,680 B2 * | 11/2016 | Schümann | C08G 18/227 |
| 9,496,155 B2 * | 11/2016 | Menard | H01L 24/26 |
| 10,468,286 B2 | 11/2019 | Burggraf et al. | |
| 10,854,775 B2 | 12/2020 | Schlemper et al. | |
| 11,024,530 B2 | 6/2021 | Burggraf et al. | |
| 11,086,056 B2 * | 8/2021 | Wolk | G02B 5/124 |
| 11,728,306 B2 * | 8/2023 | Chaji | H01L 24/29 156/272.8 |
| 2002/0115265 A1 | 8/2002 | Iwafuchi et al. | |
| 2005/0155699 A1 | 7/2005 | Hayashi et al. | |
| 2005/0162045 A1 | 7/2005 | Xu et al. | |
| 2005/0233546 A1 | 10/2005 | Oohata et al. | |
| 2008/0210368 A1 | 9/2008 | Zakel et al. | |
| 2010/0186883 A1 | 7/2010 | Tomoda | |
| 2010/0258543 A1 | 10/2010 | Mizuno et al. | |
| 2014/0339589 A1 | 11/2014 | Uhrmann et al. | |
| 2016/0329233 A1 | 11/2016 | Andry et al. | |
| 2017/0200711 A1 | 7/2017 | Uzoh et al. | |
| 2017/0358478 A1 | 12/2017 | Thothadri et al. | |
| 2018/0233394 A1 | 8/2018 | Burggraf et al. | |
| 2019/0334056 A1 | 10/2019 | Schlemper et al. | |
| 2020/0013663 A1 | 1/2020 | Burggraf et al. | |
| 2020/0243712 A1 | 7/2020 | Fukaya et al. | |

FOREIGN PATENT DOCUMENTS

| | | |
|---|---|---|
| JP | 2010-177390 A | 8/2010 |
| JP | 2019-78685 A | 5/2019 |
| JP | 2019-176154 A | 10/2019 |
| WO | WO-2011/020537 A1 | 2/2011 |
| WO | WO-2013/041136 A1 | 3/2013 |
| WO | WO-2017/076682 A1 | 5/2017 |

OTHER PUBLICATIONS

Office Action issued in Japanese Patent Application No. 2022-546039 dated Mar. 5, 2023 along with English-language translation.

\* cited by examiner

METHOD AND DEVICE FOR TRANSFERRING COMPONENTS

FIELD OF INVENTION

The invention relates to a method for the transfer of, in particular electronic, components from a sender substrate to a receiver substrate.

BACKGROUND OF INVENTION

The prior art shows the most diverse methods for transferring a product substrate from one carrier substrate to another carrier substrate. Such carrier exchange processes are mentioned in detail for example in publication WO2011120537A1. In recent years, individual functional components are increasingly being stacked above one another or beside one another. It is of crucial importance here that only those components are transferred which have passed a previous, in particular electrical, test. This thus eliminates the possibility of defective components being transferred.

SUMMARY OF THE INVENTION

It is an object of the present invention, therefore, to provide a method and a device which at least partially eliminate, in particular completely eliminate, the drawbacks stated in the prior art. In particular, it is an object of the present invention to provide an improved method and a device for transferring components from a sender substrate to a receiver substrate. A further object of the present invention is to provide an improved method and a device for the production of a light-emitting diode, with which the individual components are transferred from a sender substrate to a receiver substrate. It is a further object of the present invention to provide a method and a device, with which no defective components or only components with specific properties are transferred to the receiver substrate.

The above-mentioned problem is solved with the features of the coordinated claims. Advantageous developments of the invention are indicated in the sub-claims. All combinations of at least two features indicated in the description, in the claims and/or the drawings also fall within the scope of the invention. In stated value ranges, values lying inside the stated limits should also be deemed to be disclosed as limiting values and can be claimed in any combination. In the subsequent text, a component is understood to mean an object to be transferred. A component does not necessarily have to have a functionality as such.

Accordingly, the invention relates to a method for the transfer of, in particular electronic, components from a sender substrate to a receiver substrate with at least the following steps, in particular with the following sequence:
  i) provision and/or production of the components on the sender substrate,
  ii) transfer of the components of the sender substrate to a transfer substrate,
  iii) transfer of the components from the transfer substrate to the receiver substrate,
wherein the components can be transferred selectively by means of bonding means and/or debonding means.

During the transfer, the components can be placed or fixed on the sender substrate. It is also conceivable for the components to be produced on the sender substrate and, after their production, arranged on the sender substrate. The, in particular electronic, components are, in particular, very small components which are used in the semiconductor industry.

The transfer in step ii) can be understood in particular as the components being taken over by the transfer substrate. The transfer in step iii) can in particular be understood as a transfer of the components to the receiver substrate. In the transfer in step ii), the components arranged on the sender substrate can be contacted by the transfer substrate.

If the components are fixed on the sender substrate, this fixing can be removed during the transfer to the transfer substrate, in particular selectively for each individual component. The components can also be fixed on the transfer substrate for the transfer, in particular selectively for each individual component.

During the transfer of the components to the receiver substrate, the components or the transfer substrate can again contact the receiver substrate and/or further components arranged on the receiver substrate. Further components, which are arranged on the receiver substrate, are, in particular, components which have been transferred in a previously executed process from the sender substrate and/or further sender substrates to the receiver substrate.

A fixing on the transfer substrate can be removed, in particular selectively. The components are bonded during the transfer on the receiver substrate and/or on the further components arranged on the receiver substrate, in particular with a bonding means, in particular by means of a laser.

In particular, an alignment of the substrates with one another or, in particular, an alignment of the components and the corresponding positions for the components, in particular with the aid of alignment marks on the substrates, takes place between the individual process steps. It is of crucial importance in the method that a selective transfer of the components takes place between the sender substrate and the receiver substrate. In this way, only specific or selected components can be advantageously transferred. In particular, defective components cannot be transferred or only components with specific properties. It is also possible for all the components to be selected, wherein however the possibility for selection is provided by bonding means and/or debonding means in the respective transfers. Furthermore, a selection of the components to be transferred can advantageously take place in two steps by means of the transfer substrate.

Furthermore, the invention relates to a device for the transfer of components using the method for the transfer of the components, where components can be produced and/or provided on the sender substrate, where the components of the sender substrate can be transferred to a transfer substrate, where the components can be transferred from the transfer substrate to the receiver substrate, and where the transfer of the components to the transfer substrate and/or the receiver substrate can be carried out selectively by means of bonding and/or debonding means.

Furthermore, the invention relates to a light-emitting diode (LED) produced using the method for the transfer of components.

Provision is made in an embodiment of the invention such that individual components or a plurality of components are fixed, locally limited, during the transfer in step ii) and/or in step iii), by the bonding means, in particular by laser radiation. It is of crucial importance in the method that, during the transfer, the components can be fixed or the fixing can be removed in each case individually, so that a selective transfer of the components can thus take place. A locally limited action of the bonding means on two or more components is also conceivable. However, each component can be fixed, in particular bonded, individually on the transfer substrate or the receiver substrate. A selection is thus advantageously made possible during the transfer.

In another advantageous embodiment of the invention, provision is made such that individual components or a plurality of components are released, locally limited, during the transfer in step ii) and/or in step iii), by the debonding means. It is of crucial importance that, during the transfer of the components, the latter can be released individually by debonding means, so that only selected components are released or transferred. Defective components can thus once again be excluded from the transfer by the omission of a release. A locally limited release of two or more components is also conceivable. A selection during the transfer is thus advantageously made possible.

Furthermore, provision is preferably made such that fixing of the individual components or a plurality of locally adjacent components and removal of the fixing of the individual components or plurality of locally adjacent components by the bonding means or the debonding means takes place simultaneously and/or offset in terms of time and space. The components to be taken over are then first fixed, for example to the transfer substrate, and then the fixing to the sender substrate is removed, so that the components cannot slip during the transfer. The same applies during the transfer of the components from the transfer substrate to the receiver substrate.

In another advantageous embodiment of the invention, provision is made such that, for the purpose of the selection, the components are tested at least once by a, in particular electrical, test for functionality. In particular, functional components which are not defective can thus be determined. Functional components can perform the function for which they are intended. By determining the functional components, the latter can be selectively transferred from the sender substrate to the receiver substrate. It is also conceivable, however, that components are functional, but nonetheless are not transferred, since, for example, they perform a function other than the function required in the production process at the corresponding position of the receiver substrate. It is also conceivable that a corresponding, in particular functional, component with the required function is already present at the corresponding position on the receiver substrate.

The electrical test can in principle take place before, during or after the transfer. In the case where the components have been produced on the sender substrate, a test preferably takes place before the transfer to the transfer substrate, in order that defective components are not transferred to the transfer substrate. A second test after the transfer to the transfer substrate is also conceivable. In particular, it can also be checked whether the components are arranged at the intended position.

If the components have slipped or are in a wrong position, a transfer can also be prevented in this case, and so a selection can take place.

In another advantageous embodiment of the invention, provision is made such that, during the transfer in step ii), the transfer substrate contacts and/or applies pressure to the components provided on the sender substrate, so that the components are kept in a specific position between the sender substrate and the transfer substrate. Slipping can thus be prevented, in particular when the components are not or are no longer fixed to the sender substrate, and the corresponding position can be maintained during the fixing and/or the removal of the fixing of the components. Furthermore, a contact of the components with the transfer substrate can thus be produced, as a result of which, for example, a bonding process to the transfer substrate is enabled.

In another advantageous embodiment of the invention, provision is made such that, during the transfer in step iii), the components arranged on the transfer substrate contact and/or apply pressure to the receiver substrate, so that the components are held between the transfer substrate and the receiver substrate. Slipping of the components can thus be prevented, in particular when they are not or no longer fixed on the transfer substrate, and the corresponding position can thus be maintained during the fixing and/or the removal of the fixing of the components. Furthermore, a contact of the components with the receiver substrate is thus produced, as a result of which, for example, a bonding process to the receiver substrate is enabled.

In another advantageous embodiment of the invention, provision is made such that a release layer and/or an adhesion layer is applied on the sender substrate and/or the transfer substrate and/or the receiver substrate and/or the components, which layers, in particular through the action of the debonding means and/or the bonding means, change their adhesive properties with respect to the components in an adhesive area. The release layer and the adhesion layer react in particular to the bonding and/or debonding means. For example, a component, which is fixed on a release layer, can thus be released by a debonding means, in particular a laser, whereby the release layer is fused by the laser and a release of the component is thus enabled. A component can remain glued or be fixed to an adhesion layer by the action of a bonding means, in particular a laser. In combination with radiation-permeable substrates or corresponding holes in the substrates, the Individual components can thus advantageously be selectively fixed and/or a fixing can be removed.

In another advantageous embodiment of the invention, provision is made such that the sender substrate and/or the transfer substrate and/or the receiver substrate are designed permeable for laser radiation. The introduction of the laser radiation can thus advantageously take place from the side of the respective substrate facing away from the component. For example, the sender substrate can be a glass, which comprises a release layer on the side facing the component, said release layer fixing the components on the sender substrate. By means of the laser radiation, the release layer is then in particular fused or the adhesive property of the release layer in the adhesive area of the respective components is reduced, so that the respective components can be released. This process can also be applied analogously to the transfer substrate and the receiver substrate. Such a process is also conceivable with an adhesion layer, wherein the adhesive properties are increased or the respective components are temporarily or permanently bonded. The substrates can for example also comprise holes, so that the laser radiation can be advantageously introduced without having to require permeability of the substrates for the laser radiation.

In another advantageous embodiment of the invention, provision is made such that the transfer substrate comprises fixing elements, which fix the components during the transfer, in particular by surface adhesion. The fixing elements then contact or apply pressure to the components provided on the sender substrate. The components are thus fixed on the transfer substrate or on the fixing elements of the transfer substrate. The fixing elements can also be designed individually controllable, so that the fixing elements themselves can take over selectively. In this case, only the components are fixed on the fixing elements which are to be transferred. In another case, it is also conceivable that all the components are first fixed on the transfer substrate and then, during the transfer to the receiver substrate, only the components selected or to be transferred are transferred to the receiver substrate by means of controllable fixing elements. A selection during the transfer can thus be carried out in an advantageous and component-protecting manner.

In another advantageous embodiment of the invention, provision is made such that the fixing elements are made of a polymer material and/or are designed similar to a suction-cup. The fixing elements are advantageously made of a plastic and arranged regularly on the side of the transfer substrate facing the components. In particular, the transfer substrate has a suitable fixing element for each component. The fixing elements are preferably elastic, as a result of which small height differences of the components can in particular be compensated for during the fixing.

It is also conceivable that a compensation of the height differences is assisted or enabled by a flexible and elastic transfer substrate. Furthermore, the suction cup-like form is advantageous, since a surface adhesion effect can thus be created, which can fix the components without additional aids.

In another advantageous embodiment of the invention, provision is made such that the transfer substrate is deformed during the transfer by, in particular mechanical means and/or pneumatic means, so that, in particular, the components are released from the fixing elements and/or fixed by the fixing elements in a manner offset in terms of space and/or time. In this case, the transfer substrate is preferably arranged or fitted on a transfer die. By means of the deformation, in particular a concave or convex curvature, the time or the place of the components being contacted with the transfer substrate or with the fixing elements can be adjusted by the deformation. Furthermore, by means of the deformation of the transfer substrate, contacting of the components fixed on the transfer substrate with the receiver substrate and/or with the further components arranged on the receiver substrate can advantageously be adjusted. A release of the components after the transfer to the receiver substrate can also advantageously be adjusted. In this sense, the transfer substrate can also be understood as a bonding means and/or debonding means. It is also conceivable that the sender substrate and/or the receiver substrate are designed so as to be deformable in a controlled manner.

In another advantageous embodiment of the invention, provision is made such that the transfer substrate is a, in particular elastic, film. If the transfer substrate is designed as an elastic film, gentle contacting or application of pressure on the components can in particular be carried out.

Furthermore, in this case, the film is more easily deformable. Preferably, the film is arranged in a transfer die, which can deform the film in a controlled manner, in particular by mechanical and/or pneumatic means.

In another advantageous embodiment of the invention, provision is made such that the light-emitting diode is comprised of a plurality of components arranged upon one another and/or beside one another, in particular provided by different sender substrates. A plurality of different components can thus be transferred onto the receiver substrate and/or onto the further components arranged on the receiver substrate. The production process can thus be designed more flexibly, in particular if only identical electronic components with an identical function are produced or provided on a respective sender substrate.

In another advantageous embodiment of the invention, provision is made such that the positions of the components are stored in an electronic data-processing unit (EDP). The EDP can thus determine which components are transferred in what sequence. It is also conceivable that the EDP takes account of the current arrangement of already transferred components on the receiver substrate. In addition, the EDP can analyse the position of the components and, on this basis, perform a control of the bonding means or the debonding means such that the fixing or the removal of the fixing of individual components takes place more efficiently. In particular, the bonding or debonding means can act simultaneously on adjacent components. Exerting an influence on individual components remains, however, possible in principle.

The invention describes a method for transferring, in particular functional, components, in particular selectively, from a sender substrate to a receiver substrate. The transfer takes place with the aid of a transfer substrate. The components are in particular microchips, memory chips, LEDs, MEMs etc. Components which do not amount to an independent functional component until in a juxtaposition, an arrangement or stack are also conceivable. In the broader sense, component is understood to mean a part that is smaller than the substrates described in the disclosure document, in particular the sender, transfer and receiver substrate. In particular, a component can simply just be a layer of a special material, in particular an oxide layer or a nitride layer.

In another advantageous embodiment of the invention, provision is made such that only functioning, undamaged components are transferred onto the receiver substrate. In this connection, functioning, undamaged components are components which have passed the electrical test and therefore function. By means of the selective transfer, it can thus be ensured that only the functioning components are transferred from the sender substrate to the receiver substrate. In particular, the number of defectively produced products can thus be reduced and production can be carried out more efficiently.

In another advantageous embodiment of the invention, provision is made such that the bonding means and/or debonding means are a laser. The laser radiation emitted by the laser can act over the whole area and/or in a very point-like manner on the substrates or the components. The adhesive property of a surface, in particular a partial area of a substrate surface on which a component is fixed or lies and/or is to lie, can be changed by the laser radiation. A laser is advantageous especially for the fixing or removal of the fixing of individual components, since a laser can act in a very location-specific manner. Furthermore, introduction of the laser radiation can take place rapidly, in particular by a plurality of lasers. Moreover, it is conceivable that a plurality of adjacent components, which have passed the test, are fixed together or the fixing is removed simultaneously by a laser, acting in particular extensively. The transfer can thus be carried out more quickly and more efficiently. When use is made of a laser, the substrates can be designed permeable for the radiation of the laser. Materials permeable for the laser radiation and holes in the substrates are conceivable. The laser radiation can also be introduced laterally by the component, in particular onto the substrate. In principle, however, other physically and/or chemically and/or mechanically acting debonding and debonding means can be used. The laser radiation of a laser, which is used as a bonding means and/or debonding means, has a wavelength in the wavelength range between 10 nm and 100 µm, preferably between 100 nm and 50 µm, most preferably between 200 nm and 6 µm. The preferred wavelength cannot be specified more precisely, since the bonding and debonding means generally also have to be adapted to the corresponding adhesive areas. If the lasers are used as bonding and/or debonding means, the wavelength used and/or intensity depends in particular on what type of adhesive areas are used.

The components can be transferred selectively. The same technique is preferably used for bonding and debonding of the components.

Components

The components can thus be, for example, the following objects:
1. Layers, in particular
   1.1 oxide layers
   1.2 nitride layers
   1.3 metal layers, in particular of
      1.3.1 Cu, Ag, Au, Al, Fe, Ni, Co, Pt, W, Cr, Pb, Ti, Ta, Zn, Sn
   1.4 Semiconductor layers, in particular made of
      14.1 Ge, Si, Alpha-Sn, fullerenes, B, Se, Te
   1.5 Compound semiconductor layers, in particular made of
      1.5.2 GaAs, GaN, InP, InxGa1-xN, InSb, InAs, GaSb, AlN, InN, Gap, BeTe, ZnO, CuInGaSe2, ZnS, ZnSe, ZnTe, CdS, CdSe, CdTe, Hg(1-x)Cd(x)Te, BeSe, HgS, AlxGa1-xAs, GaS, GaSe, GaTe, InS, InSe, InTe, CuInSe2, CuInS2, CuInGaS2, SiC, SiGe
   1.6 Glasses, in particular
      1.6.1 sapphire glass
2. Functional components
   2.1 Mechanical components, in particular
      2.1.2 MEMS
   2.2 Electronic components, in particular
      2.2.1 LEDs,
      2.2.2 chips, in particular
         2.2.2.1 microchips,
         2.2.3.2 memory chips.

The components are between 0 µm and 1000 µm thick, preferably between 0 µm and 800 µm, still more preferably between 0 µm and 500 µm, most preferably between 0 µm and 250 µm, with utmost preference between 0 µm and 100 µm thick. On account of the miniaturisation, the components will in future probably tend to be even smaller than 10 µm.

Bonding and Debonding Means

A feature of the present invention includes bonding and debonding means, in the following text collectively also referred to as means, that are used to bond the components to substrates or debond the latter from substrates. These means can generally act over the entire area of a substrate or in a very location-specific manner. Means which act over a large area are for example electromagnetic rays, in particular thermal radiation, from a surface radiator. The surface radiators then preferably have a radiation area, which is at least as large as the area of the substrate. The one-sided exposure of a substrate to temperature is made possible by subjecting a substrate side to such electromagnetic radiation acting over a large area. The use of a laser would also be conceivable, which is widened by optical systems and can act over the full area of the surfaces to be acted upon.

It is also conceivable that the chamber in which the substrates are located is heated to a temperature. In this case, the substrates would however be heated on both sides.

The temperatures used should of course lie in ranges which do not lead to damage to the components and/or the substrates. The temperatures are thus preferably as low as possible. The temperature to achieve the effect according to the invention is less than 1000° C., preferably less than 500° C., still more preferably less than 250° C., most preferably less than 100° C., with utmost preference less than 50° C.

In a very particularly preferred embodiment, the means are, in particular mobile, electromagnetic radiators acting in a locally limited manner, in particular lasers. A locally targeted adjustable bonding and/or debonding is made possible by a relative movement between the surface to be irradiated and the lasers. The means themselves are preferably static, whereas the substrate holder on which the substrate or the substrates are fixed moves.

Sender Substrate

Sender substrate is used to denote a substrate which has a plurality of components. It represents the substrate which is present at the beginning of the transfer process and makes the components available which are to be transferred to the receiver substrate.

In an embodiment, the components can have been produced on or from the sender substrate. Especially when the components are simple layers, the latter can be produced by special physical and/or chemical processes directly on the sender substrate and optionally structured by further process steps.

In a further embodiment, the components have been produced at another location and have been positioned on the sender substrate in order to be taken over by the transfer substrate in the following transfer process. The components are then preferably connected by an adhesion mechanism to the sender substrate. The sender substrate is preferably designed such that the adhesion mechanism, with the aid of which the components are fixed on the sender substrate, can be weakened from the underside of the sender substrate. The weakening preferably takes place by means of a laser. As a result of the weakening of the adhesion mechanism, the components can easily be removed from the sender substrate onto the transfer substrate in the subsequent transfer process, after they have been bonded to the transfer substrate. The weakening of the adhesion mechanism and the subsequent removal of the component is also referred to as debonding. In particular, the debonding process can take place selectively. Thus, it is conceivable that only those components are released from the sender substrate that have passed a previous functional, in particular in electrical, test. Damaged components are thus prevented from being transferred.

It is also conceivable that the components have been simply placed on the sender substrate and no special fixing mechanism is acting between the sender substrate and the component.

In a particularly preferred embodiment, the sender substrate is a glass substrate.

In another embodiment, the sender substrate is a wafer, in particular a silicon wafer.

In a further embodiment, the sender substrate is a film. The film is preferably stretched out on a frame in order to fix and stabilise it. It is, however, also conceivable for devices with continuous films to be used in order to carry out the process.

In a most general embodiment, a sender substrate can be any kind of, in particular planar, surface, from which components can be removed. A kind of table surface, machine surface or granite slab surface would for example be conceivable. The term sender substrate, in contrast with the two other mentioned types of substrate, the transfer and the receiver substrate, is therefore to be construed in the broadest possible sense.

Transfer Substrate

The transfer substrate serves to transport the components from the sender to the receiver substrate.

In a particularly preferred embodiment, the transfer substrate is a film. The film is stretched out on a frame in order to fix and stabilise it. It is however also conceivable for devices with continuous films to be used to carry out the process. A film has the advantage that it is elastic and flexible, as a result of which it is particularly easy to contact components in the case of height differences of several micrometres or nanometres but with a surface lying beneath.

In a less preferred embodiment, the transfer substrate is made of glass.

In a least preferred embodiment, the transfer substrate is a wafer, in particular it is a silicon wafer.

In an embodiment, the transfer substrate is a substrate with a plurality of fixing elements.

The fixing elements serve to hold the components fixed. The fixing elements can be
1. Mechanical fixings, in particular
    1.1. Clamps
2. Vacuum fixings, in particular with
    2.1. individually controllable vacuum tracks
    2.2. vacuum tracks connected to one another
3. Electrical fixings, in particular
    3.1. Electrostatic fixings
4. Magnetic fixings
5. Adhesive fixings, in particular
6. Gel-Pak fixings
7. Fixings with adhesive, in particular controllable, surfaces.

The fixing elements are in particular electronically controllable. A vacuum fixing preferably comprises a plurality of vacuum tracks, which emerge at the surface of the transfer substrate. The vacuum tracks are preferably individually controllable.

The fixing elements have approximately the size of the components to be transferred and are preferably provided symmetrically at the surface of the transfer substrate. The fixing elements are preferably designed in a suction cup-like manner. This kind of transfer substrate is used in connection with a transfer die, which is described in detail in the disclosure of the invention.

Receiver Substrate

The receiver substrate is understood to mean the product substrate, on which all the components, in particular from a plurality of transfer substrates and/or the repeated use of the same transfer substrate, are fixed.

Components can be transferred from different sender substrates via one or more transfer substrates to the same receiver substrate. A particularly efficient and above all diversified component transfer is thus made possible. Components having a different functionality can be bonded from a plurality of sender substrate or transfer substrate sources on the same receiver substrate. A transfer onto the receiver substrate also means that the components can follow components already arranged, in particular bonded, on the receiver substrate.

The disclosed substrates can be coated differently. In particular, the layers are functional layers, the adhesive properties of which can be changed by an external influence. It is thus possible to transfer the components from one substrate to another substrate. An influence acting locally, i.e. on a single component, is in particular provided. This feature distinguishes the method decisively from the prior art, in which use is made in particular of heat for the full-area influencing of the entire wafer, in order to bring about a change in the adhesive properties.

Types of Bond

At least one of the following types of bond is preferably used in order to connect the components to a carrier via an adhesive area:
Adhesion bond,
Metal-metal bond,
Eutectic bond,
Anodic bond, or
Fusion bond.

The individually listed types of bond are described in greater detail with regard to their mode of functioning.

In the case of the adhesion bond, it is conceivable that the acting bonding means, in particular a laser, at least improves the adhesive properties of the adhesive used. It would for example be conceivable that mixing of two components of the adhesive takes place by the introduction of heat, and that an adhesive property is only produced by the mixing. In another embodiment, the bonding means for the adhesion bond is a cooling device acting in particular in a locally limiting manner, which reduces the temperature. It would be conceivable that the adhesive has molecule side chains, which are decisively responsible for the adhesive property. The cooling could reduce the thermal movement and the molecule chains could, in particular by self-assembling, experience a more marked parallel alignment, which leads to an increase in the adhesive property.

In the case of the metal-metal bond, the bonding principle includes two metals, in particular completely mixable with one another, that make contact with each other and, through the action of a bonding means, in particular a laser, are heated up to an extent such that they bond with one another by compression and/or diffusion. A bond thus produced is difficult to separate in most cases, especially with the formation of intermetallic phases, so that it should be used in particular as a bond for an end state, i.e. a connection of a component to a surface which no longer has to be released.

In the case of the eutectic bond, the bonding principle includes at least two metals, which are capable of constituting a eutectic, that are heated via the eutectic temperature. Use is preferably made of metal combinations, the eutectic temperature of which is as low as possible, so that only small temperature increases are required. The advantage of such eutectic alloys includes the fact that the eutectic can be fused any number of times. In contrast with a metal-metal bond with a relatively high melting point, therefore, eutectic bonds are also suitable for debonding processes. A drawback, however, is that the debonding process must take place above the eutectic temperature, at which a not inconsiderable quantity of melt is present, which could contaminate parts of the substrates.

In the case of the anodic bond, the movement of ions is promoted by the application of an electric field. Anodic bonds are primarily used for glass substrates. This bonding process will not be dealt with in greater detail. It is known to the person skilled in the art.

One of the most important bonding processes for the method according to the invention is fusion bonding. In the case of the fusion bond, the surfaces to be connected, which are in particular cleaned and treated with plasma, make direct contact with one another, in particular at room temperature. This thus results in the formation of a pre-bond. The pre-bond is preferably converted by an increase in temperature into a permanent bond. Such mechanisms are also very well known to the expert in the field. The fusion bond is preferred for the method according to the invention especially because a pre-bond between a component surface and the carrier substrate represents a rapid and efficient method of temporarily fixing the component to the carrier substrate in an easily releasable manner. In this case, the carrier substrate must of course be suitable for fusion bonds or the pre-bonds. A further advantage includes the fact that fusion bonds are sought in the semiconductor industry in order to connect a plurality of components directly to one another, preferably by so-called hybrid bonds. This particularly preferred embodiment will be described in greater detail in the text.

During the transfer of the components from the sender to the transfer substrate, the bonding process must be selected with the aid of which the component can be adequately fixed to the transfer substrate. This produced bond must however be sufficiently easily released again by means of a debonding means during the transfer of the component from the transfer substrate to the receiver substrate. The correct combination of the type of bonding and bonding or debonding means, therefore, is important in order to be able to carry out the transfer of the components in a smooth manner, in particular free from errors.

The transfer substrate is particularly preferably a film or a stiff substrate with an adhesive layer. In this case, it may be that the adhesive of the adhesive layer is self-adhesive, i.e. does not have to be activated by a bonding means according to the invention, like for example an adhesive. However, the adhesive strength of the adhesive layer is advantageously at least improved by the action of an adequate bonding means.

In a particular embodiment, a multi-layer system is used in order to bond the components to the carrier. For example, it is conceivable that a layer system, comprising a release layer and an adhesive layer are combined.

The release layer can also be referred to as a reaction layer, since the action of a debonding means leads to a reaction, which leads to a reduction in the adhesion between the carrier and the component and thus enables the release of the component from the carrier. The sequence of release layer and adhesion layer is arbitrary, preferably however the release layer is applied to the carrier. Publication WO2017076682A1 discloses for example a multi-layer system, in which the release layer is applied to the product substrate and not to the carrier substrate. The disclosure of the invention summarises the use of such a multi-layer system in terms of the more general concept of an adhesive area.

The layer systems can be applied over the full area of one of the substrates and/or on the components. Technically, a full-area application of a layer system on a substrate is easier, since known coating technologies such as centrifugal and/or spray coating can be used. Whilst a partial application of such a layer system on a substrate is possible, it is preferred less on account of the cost. A full-area application of a layer system with subsequent structuring is of course conceivable. If a layer system is to be applied on a substrate, it preferably covers its surface completely.

Transfer Processes

In a first process step of an illustrative method according to the invention, components are produced or placed on a sender substrate. The components can be loaded onto the sender substrate or directly produced on the sender substrate. The components are in particular connected via their first component surface to the sender substrate surface in such a way that a straightforward release of the components, in particular controlled in a targeted manner, from the sender substrate surface can take place. If there is no connection between the sender substrate and the component, because, for example, the components have simply been placed on the sender substrate, it is all the easier for those to be removed from the sender substrate.

In an optional second step of the first process, each individual component can be tested for its functional capability. The position of defective components or components that do not correspond to the specifications can be stored by a computer program in order to prevent a subsequent transfer process of the components. In particular, this process step can also take place for each component individually before the first process step. Technically, however, it can be advantageous first to position the components and then to quickly test them by an automated measuring probe.

In a third process step of the first process, the alignment of a transfer substrate with the sender substrate takes place. The alignment takes place mechanically and/or optically. An alignment preferably takes place by means of alignment marks, which are located on the sender and on the transfer substrate. Optical alignment systems are preferably used for the alignment.

In a fourth process step of the first process, the second component surfaces of the components, which lie in particular opposite the first component surface on the sender substrate, are brought into contact with the transfer substrate surface or at least brought so close to the latter that the components can be transferred from the sender substrate to the transfer substrate. In particular, it may be necessary for the transfer substrate and/or the sender substrate to be locally deformed to an extent such that the second component surface contacts the transfer substrate surface. If the transfer substrate is a film, this process can be carried out particularly easily, since the film can easily be locally deformed.

Deformation by a small die from the rear side of the film would for example be conceivable. The die is combined in particular with the laser or the laser components.

In a fifth process step of the first process, bonding takes place between the second component surface of the components on the sender substrate and the transfer substrate surface. The bond is preferably a temporary bond. In a particularly preferred embodiment, the bonding between the second component surface of each individual component and the transfer substrate surface takes place individually, i.e. selectively. In this process step, therefore, a decision can already be made as to which of the components, if any, is to be transferred. In a particularly preferred embodiment, the bonding takes place with the aid of a laser. The different options for producing a bond are explained comprehensively at other points in the published patent application.

In a sixth process step of the first process, debonding takes place between the first component surface of the components on the sender substrate and the sender substrate surface.

It would also be conceivable that process steps five and six are exchanged with one another, i.e. that the debonding process between the first component surface of the components on the sender substrate first takes place and only then the bonding process between the second component surface of the components and the transfer substrate takes place. The exchange of the process steps is possible on account of a force acting on the components, in particular on both sides, which holds the components in position. However, with the exchange of the process step, there is the risk of the components slipping. It would also be conceivable for the bonding and the debonding process to take place simultaneously.

In another embodiment, it would be conceivable for the bonding and the debonding process to take place simultaneously.

In a seventh process step of the first process, an alignment of the previously loaded transfer substrate with a receiver substrate takes place. The alignment takes place mechanically and/or optically. An alignment preferably takes place by means of alignment marks, which are located on the transfer substrate and on the receiver substrate. Optical alignment systems are preferably used for the alignment.

In an eighth process step of the first process, the first component surfaces of the components on the transfer substrate are brought into contact with the receiver substrate surface or with the second surfaces of other components already loaded on the receiver substrate. In particular, it may be necessary for the transfer substrate and/or the receiver substrate to be locally deformed to an extent such that the first component surface contacts the receiver substrate surface or the surface of the previously fixed components. All the advantages and drawbacks of the deformation have already been described in the fourth step when the component is received on the transfer substrate and accordingly can be applied analogously to the eighth step.

In a ninth process step, a debonding and bonding process is then again carried out. The debonding process this time takes place between the components on the transfer substrate and the transfer substrate, while the components are bonded, in particular simultaneously, to the receiver substrate surface or to the second surfaces of other components already loaded on the receiver substrate. The bonding or debonding processes employed are described in the disclosure and selected depending on what the situation requires in each case. Especially in the case of the stack of a plurality of components on top of one another, the latter are fusion-bonded, preferably hybrid-bonded, insofar as they have hybrid surfaces. By means of a hybrid bond, a required electrically conductive connection between the components is advantageously produced.

In a second illustrative transfer process according to the invention, the transfer substrate has in particular individual fixing elements, which by means of surface adhesion are able to fix the components. The fixing elements are preferably very elastic, flexible and expandable bodies, preferably produced from polymer materials. Clearly, fixing elements can be thought of as a kind of suction cup. When use is made of such a carrier, wholly different bonding and debonding means are in particular used.

In this case, a bonding means is understood to mean contacting of the fixing elements with the components on a sender substrate, in particular in combination with an application of force. The application of force can take place by means of a pressing element, for example by means of a roller.

The acting force lies in the range between 0 MPa and 1000 MPa, preferably between 0 MPa and 750 MPa, still more preferably between 0 MPa and 500 MPa, most preferably between 0 MPa and 250 MPa, with utmost preference between 0 MPa and 100 MPa.

It is also conceivable for the pressure in the chamber in which the fixing elements are contacted by the components to be increased. The fixing elements are thus pressed more intensely onto the components.

In this case, a debonding means is understood primarily as bending of the transfer substrate in a way such that the fixing elements are released from the components successively, in particular from the outside inwards, after the components have been fixed, in particular permanently bonded, on the receiver substrate. This bonding process can for example take place very well with a bonding means from the first process, for example a laser.

In the second illustrative method according to the invention, use is made of a transfer die, which has at the underside a transfer substrate with a plurality of fixing elements. The process differs primarily in that the transfer die is structured in a somewhat more complicated manner than the simple transfer substrates. Apart from a transfer substrate, it preferably also comprises further control means, which in particular can influence and above all control the curvature of the transfer substrate. Furthermore, the transfer substrate comprises fixing elements which are not present with the previously described transfer substrates. Use of the transfer substrate with the respective fixing elements without a die lying behind would also be conceivable. The curvatures for the bonding and debonding would however then have to take place by other mechanical and/or pneumatic and/or hydraulic means, which would have to be regarded independently of the transfer substrate. The second process is now described in detail.

In a first process step of the second process, components are produced or placed on a sender substrate. The components can be loaded onto the sender substrate or directly produced on the sender substrate. The components must be connected via their first component surface to the sender substrate surface in such a way that a straightforward release of the components, in particular controlled in a targeted manner, from the sender substrate surface can take place. If there is no connection between the sender substrate and the component, because for example the components have simply been placed on the sender substrate, it is all the easier for them to be removed from the sender substrate. A disadvantageous effect, however, is that the components could in this case slip before and/or while they are being contacted by the transfer substrate in a further process step.

In an optional second step of the second process, each individual component can be tested for its functional capability. The position of defective components or components that do not correspond to the specifications can be stored by a computer program in order to prevent a subsequent transfer process of the components. In particular, this process step can also take place for each component individually before the first process step. Technically however, it can be advantageous first to position the components and then to quickly test them by an automated measuring probe.

In a third process step of the second process, the alignment of the sender substrate with a transfer substrate takes place. The transfer substrate is preferably part of a transfer die, but can also be used alone. In contrast with the transfer substrate from the first process, the transfer substrate comprises a plurality of fixing elements. The alignment takes place mechanically and/or optically. An alignment preferably takes place by means of alignment marks, which are located on the sender and on the transfer substrate. Optical alignment systems are preferably used for the alignment. The transfer substrate is in particular positioned such that the fixing elements of the transfer substrate are located over the components to be transferred. This aspect differs from the first process.

In a fourth process step of the second process, the second component surfaces of the components on the sender substrate are brought into contact with the fixing element surfaces of the fixing elements. In particular, it may be necessary for the transfer substrate and/or the sender substrate to be locally deformed to an extent such that the second component surfaces contact the fixing element surfaces. If the transfer substrate is a film, this process can be carried out particularly easily, since the film can easily be locally deformed. However, the combination of the fixing elements with a film is technically disadvantageous, since the film may have insufficient ability for the fixing elements. The fixing elements are therefore preferably produced or fastened on transfer substrates which have the necessary stability, in particular a certain rigidity. Since the fixing elements are preferably polymer fixing elements, in particular suction cup-like fixing elements, it is conceivable to carry out the deformation of the transfer substrate by generating an excess pressure. If the components are transferred from the sender substrate to the transfer substrate in a vacuum, the use of mechanical aids for the application of pressure, in particular rollers, is conceivable. In a particularly simple embodiment, however, only the transfer substrate is moved in the direction of the sender substrate to an extent such that sufficient pressure is built up by the movement in order to produce a complete contact between the fixing elements and the components.

In a fifth process step of the second process, bonding takes place between the second component surface of the components on the sender substrate and the transfer substrate surface. The bond is preferably a temporary bond. In a particularly preferred embodiment, the bonding between the second component surface of each individual component and the transfer substrate surface takes place individually, i.e. selectively. In this process step, therefore, a decision can already be made as to which of the components, if any, is to be transferred. However, since fixing elements are used in the second process, the selective choice of components to be transferred can only take place when the fixing elements are switchable or controllable themselves. Switchable, adhesive fixing elements, which can change their adhesive properties by means of current, would be conceivable. Since the fixing elements are constituted similar to suction cups, it would be conceivable to produce a selective bonding process by means of a targeted, local force effect. For this purpose, the means for applying the force from the rear side would however have to be able to act itself in a locally selective manner, i.e. have a limited diameter. The use of a pin, for example, would be conceivable. Especially when use is made of a transfer die, this pin would probably have to be located inside the transfer die. The design of the transfer die would be correspondingly complicated. It would be conceivable, however, to provide a small x-y translation unit behind the transfer die surface, which can move a pin in the z-direction. If the transfer die is omitted, the means for applying the force must be part of the system in which the transfer of the components takes place.

In a sixth process step of the second process, debonding takes place between the first component surface of the components on the sender substrate and the sender substrate surface.

It would also be conceivable that process steps five and six are exchanged with one another, i.e. that the debonding process between the first component surface of the components on the sender substrate first takes place and only then the bonding process between the second component surface of the components and the transfer substrate takes place. The exchange of the process steps is possible on account of a force acting on the components, in particular on both sides, which holds the components in position. However, with the exchange of the process step, there is the risk of the components slipping.

In another embodiment, it would be conceivable for the bonding and the debonding process to take place simultaneously.

In a seventh process step of the second process, an alignment of the previously loaded transfer substrate with a receiver substrate takes place. The alignment takes place mechanically and/or optically. An alignment preferably takes place by means of alignment marks, which are located on the transfer substrate and on the receiver substrate. Optical alignment systems are preferably used for the alignment.

In an eighth process step of the second process, the first component surfaces of the components on the transfer substrate are brought into contact with the receiver substrate surface or with the second surfaces of other components already loaded on the receiver substrate. In particular, it may be necessary for the transfer substrate and/or the receiver substrate to be locally or globally deformed to an extent such that the first component surface contacts the receiver substrate surface. A global curvature of the transfer substrate by means of a pressing device located behind the transfer substrate would in particular be conceivable.

The ninth process step primarily comprises the release of the components from the fixing elements of the transfer substrate, which corresponds to the debonding process. The bonding process between the components and the receiver substrate surface or to the second surfaces of other components already loaded on the receiver substrate again takes place similar to the methods already mentioned in the disclosure. This time too, it again involves a fusion bond, preferably a hybrid bond.

All the advantages and drawbacks of the deformation have already been described in the fourth step when the component is received on the transfer substrate and can accordingly be applied analogously to the eighth step.

The difference between the first and the second process primarily is that in the second process the fixing elements are used as important technical components.

An important task is attributed to the positioning of the arrangement of the components. In a preferred extension of the invention, the positions of the components establish themselves by a self-assembling process. For this purpose, the surface on which the components are to be positioned must be specially prepared.

An embodiment of the self-assembling comprises the coating of the surface with a low-adhesion layer (ASL, anti-sticking layer), which covers only those areas of the surface in which the components must not be positioned. These areas are referred to below as ASL areas. The areas of the surface at which the components are to be positioned are not covered by the anti-sticking layer and therefore have a high adhesion, especially relative to the anti-sticking layer. These areas are subsequently referred to as adhesive areas. Once the components are positioned on the adhesive areas, positioning errors in the micrometre or nanometre range are corrected by the fact that the components move into the adhesive areas due to adhesion gradients present. The adhesive areas themselves are preferably symmetrical, in particular at least rectangular. The greater the symmetry of the adhesive areas, the more efficient the self-assembling process.

A further embodiment of the self-assembling comprises coating with a fluid areas in which a component is to be positioned. The remaining surrounding area, in which no components are to be positioned, remains untreated. When a component is placed on one of these areas, the component is drawn into the centre of the fluid by adhesion processes and energy minimisation processes that arise, in such a way that it is positioned symmetrical with the fluid by the self-assembling process. If the fluid has thus been very precisely deposited, in particular with micrometre or nanometre precision, and the contact surface of the component to be positioned has the same shape as the fluid, the component is preferably aligned such that it comes to a standstill symmetrical with the fluid. It floats as it were over the fluid. This self-assembling according to the invention only makes sense of course when the fluid may be present between the surface and the component permanently or at least until the further removal of the component onto another substrate.

Multi-Layer LED

In a particularly preferred embodiment, the method is used in order to produce a light-emitting diode (LED), preferably a white light LED (wLED). The wLED can be produced in a variety of ways.

There are several types of white light to be produced in the semiconductor industry. One possibility includes the use of phosphorescent layers, which are irradiated by excitation radiation and emit a broader-band spectrum of light (WO2013041136A1).

A further possibility for producing white light includes the production of a wLED, which comprises three individual LEDs from which each individual LED emits light in a specific wavelength range, in particular in the red (rLED), green (gLED) and blue (bLED) wavelength range. White light can be produced by mixing the three colour components. Each of the three individual LEDs is, generally speaking, produced by different materials and production processes. Each of the individual LEDs is regarded as a component which, with the aid of the process, can be combined on a receiver substrate to form a fully functioning wLED.

In a first illustrative embodiment according to the invention, the wLED to be produced comprises three LEDs (rLED, gLED and bLED) arranged beside one another.

In a second, preferred embodiment, the wLED to be produced comprises three LEDs (rLED, gLED and bLED) stacked one above the other. In order to ensure that the light of the bottom LED and/or the middle LED is not absorbed too intensely by the LED or LEDs lying above, the size of the LEDs can continuously diminish from bottom to top. In an improved second embodiment, the bottom LED covers the full area, the middle LED bonded onto the latter is annular and the uppermost LED is also annular with a larger inner radius than the middle LED. The shape of the annular LEDs can be rectangular or circular.

BRIEF DESCRIPTION OF THE DRAWINGS

The LEDs are preferably stacked in such a way that the absorption by the LEDs lying above is minimised. The correct sequence generally has to be determined empirically and depends primarily on the material of the individual LEDs.

Further advantages, features and details of the invention emerge from the following description of preferred examples of embodiment and with the aid of the figures. In the figures, schematically.

DETAILED DESCRIPTION OF THE INVENTION

In the figures, identical components or components with the same function are denoted by the same reference numbers.

The figures are not drawn true to scale. In particular, adhesive areas 3 are represented very bold for the sake of illustration. The reason for the exaggerated representation of adhesive areas 3 includes the fact that the use of bonding means 6 and debonding means 7, which produce and again release the adhesive areas 3, is an essential feature of the invention. If adhesive areas 3 are represented visibly, adhesion is in particular present between the components touching adhesive areas 3. If no adhesive area 3 is represented, such an adhesion is not present or is so to such a small extent that it can be technically disregarded. An adhesive area 3 not shown at a certain position does not mean that a bonding agent, for example an adhesive, must no longer be located at this position. It merely means that the bonding agent, in particular the adhesive, has no adhesive effect and at least a negligible adhesive effect, in particular because the adhesive effect has been changed, in particular reduced or even completely removed by a debonding means 7.

Figure 1A:
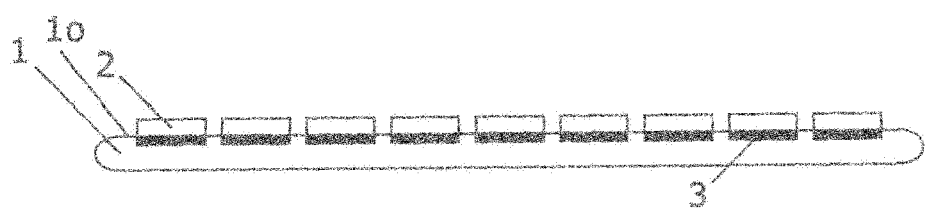
FIG. 1a shows a first process step of an illustrative method according to the invention.

FIG. 1a shows a first process step in which a sender substrate 1 is provided with a plurality of components 2. Components 2 are preferably already firmly connected to sender substrate 1 via adhesive areas 3 in this process step, so that slipping of components 2 is prevented. The firm connection between components 2 and sender substrate 1 is produced by a chemical and/or physical adhesive area 3. Adhesive area 3 can for example be an adhesive which acts as a bonding agent between sender substrate 1 and component 2. It is also conceivable that the adhesive area is an area of the order of a micrometre or a nanometre, in which direct adhesive forces act between the surfaces of sender substrate 1 and component 2, in particular van-Der-Waals forces. It is also conceivable that adhesive area 3 is a metal alloy, in particular solder. It is also conceivable that adhesive area 3 is an adhesive film. For adhesive area 3, all chemical and/or physical effects and/or materials and/or objects generally come into question, with the aid of which component 2 can be fixed on sender substrate 1. An adhesive area 3 is always represented in FIG. 1 only on the boundary between a component 2 and sender substrate 1. It is however also conceivable that adhesive area 3 is extended over entire transfer substrate surface 1o. In particular, adhesive area 3 is then a layer, which has been applied by a coating process, in particular a centrifugal coating process. It is also conceivable that components 2 are a layer, in particular an oxide layer or nitride layer, which has first been applied over the full area by suitable coating processes and suitably structured by other process steps. In this case, adhesive area 3 simply corresponds to just the boundary surface, the interface, between the layer and sender substrate 1. In this case, the layer is thus directly connected to sender substrate 1. It is of course also conceivable that component 2 simply represents a layer system, which has been correspondingly deposited and structured. Sender substrate 1 is represented in all the figures by way of example as a wafer, but can basically be any kind of substrate, in particular also a glass substrate or a film.

Figure 1B:
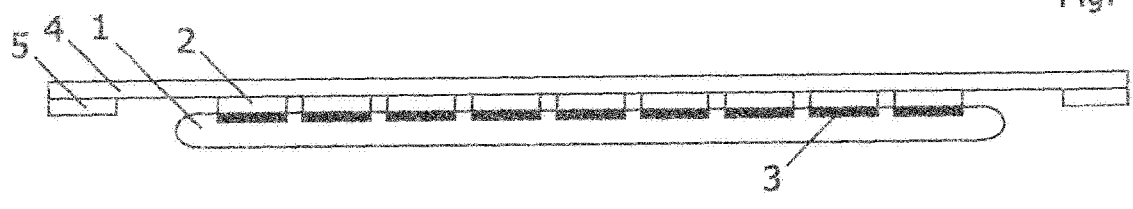
FIG. 1b shows a second process step.

FIG. 1*b* shows a second process step, in which a transfer substrate 4, in particular a film which has been stretched out on a frame 5, is positioned and fixed over components 2 of sender substrate 1. In particular, a slight application of pressure from the rear side of transfer substrate 4 suffices. It is also conceivable that frame 5, on which transfer substrate 4 constituted as a film has been stretched out, is moved in the direction of sender substrate 1, in order that transfer substrate 4 is preloaded and presses on components 2. In particular, transfer substrate 4 can have been aligned relative to sender substrate 1 before the contacting. The alignment preferably takes place with the aid of alignment marks (not shown) and optical aids, in particular alignment systems (not shown).

Figure 1C:
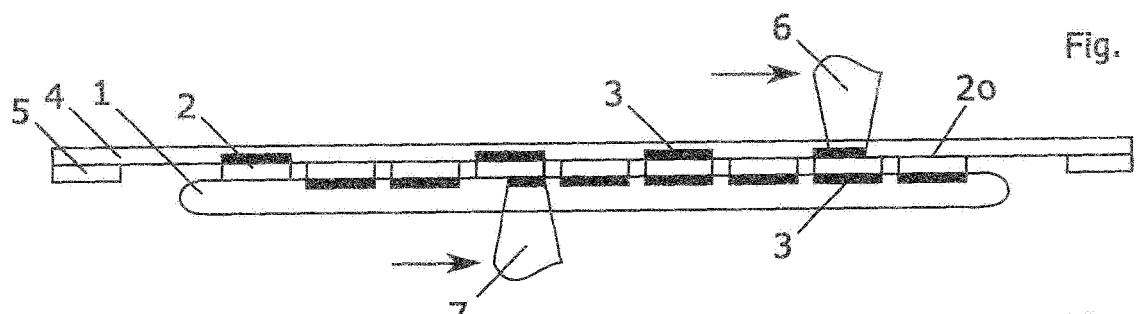
FIG. 1c shows a third process step.

FIG. 1*c* shows a third process step, in which a bonding process of components 2 with the aid of a bonding means 3, in particular with the aid of a laser, takes place via component surface 20 in such a way that an adhesive area 3 is formed between component 2 and transfer substrate 4. A debonding process with the aid of a debonding means 7, preferably also with the aid of a laser, takes place in particular simultaneously, still more preferably with a small time and/or path offset. This debonding process preferably takes place through sender substrate 1. Debonding from the side of transfer substrate 4 would also be conceivable. Debonding means 7 for the debonding must not however have any interaction with adhesive area 3 between transfer substrate 4 and components 2. In a particularly preferred embodiment, the bonding process and debonding process would be carried out simultaneously. Also conceivable, for example, would be the use of a laser which on the one hand acts as a bonding means 6 and produces a bonding process between components 2 and transfer substrate 4, on the other hand acts as a debonding means 7 and carries out a debonding process between components 2 and sender substrate 1. Accordingly, adhesive areas 3 at the different sides of components 2 would have to react differently to the photons of laser 6. The figure represents by way of example only the bonding or debonding process of four components 3 (see also in this regard FIG. 1*d*) in order to illustrate that the transfer process can already take place selectively in this process step. The reason for a selective transfer process would be that some of components 2 are defective and must not therefore be transferred. All components 2 can of course be transferred. In particular, defective components 2 should in fact not be present at all on a sender substrate. If, however, the components are produced on sender substrate 2, some of components 2 can indeed be defective during the production process. In this case, the selective choice would make technical sense and be necessary.

Figure 1D:
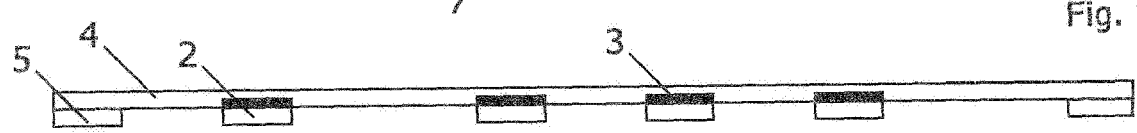
FIG. 1d shows a fourth process step.
Figure 1D:
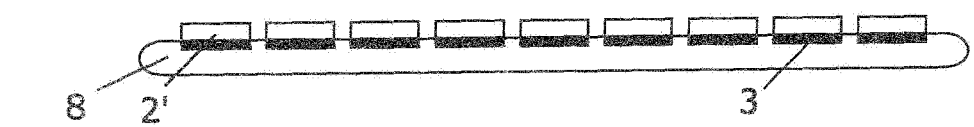

FIG. 1*d* shows a fourth process step in which transfer substrate 4 is positioned over a receiver substrate 8, in particular is aligned with the latter. The alignment preferably takes place by means of alignment marks (not shown) and with the aid of an optical alignment system (not shown).

Figure 1E:
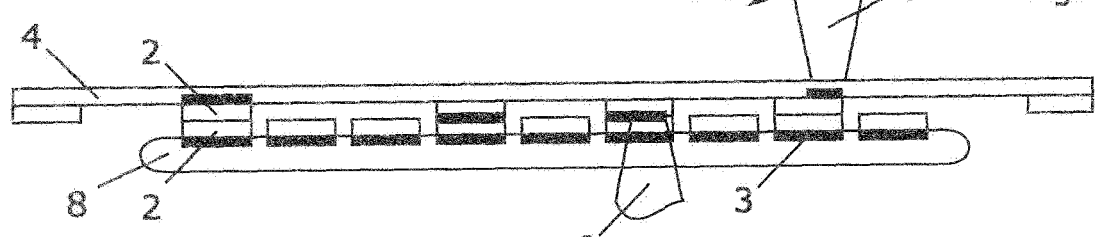
FIG. 1e shows a fifth process step.

FIG. 1*e* shows a fifth process step, in which, after the contacting of components 2 of transfer substrate 4 with components 2 of receiver substrate 8, a debonding means 7, in particular a laser, carries out a debonding process between components 2 of transfer substrate 4 and transfer substrate 4, preferably through the rear side of transfer substrate 4. The production of an adhesive area 3 between components 3 takes place with the aid of a bonding means 6, in particular simultaneously. The figure represents by way of example only the debonding process of three components 3 in order to illustrate that the transfer process can again be carried out selectively in this process step.

In a very preferred embodiment, components 2 are released only from transfer substrate 4 by a selectively acting debonding means 7, whereas bonding means 6 is not a selective bonding means, but rather a bonding means acting over the area. A heated surrounding area, for example, would be conceivable. This can make sense in particular when components 2 are to be connected to one another permanently by a metal-physical bonding process or by a fusion-bonding process.

Figure 1F:
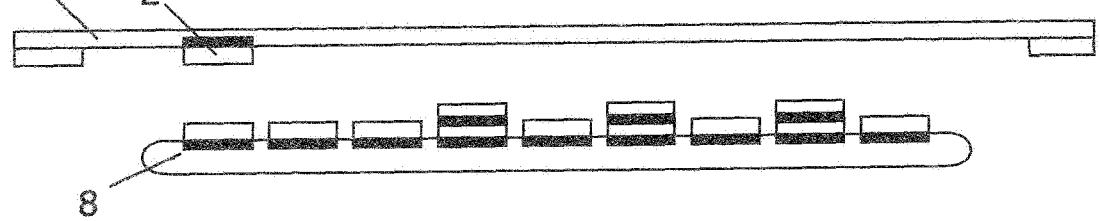
FIG. 1f shows a sixth process step.

Figure 1*f* shows a sixth process step in which transfer substrate 4 is lifted and removed with a single remaining component 2. It can be seen that a total of three components 3 have been transferred. In particular, the bonding process with the aid of bonding means 6 represented in FIG. 1*e* can also only be carried out when this process step is reached. Transfer substrate 4 also has a component 2, which can be transferred for example to another receiver substrate 8.

The transfer of an always identical number of components 3 from a sender substrate 1 to a receiver substrate 8 is of course preferable. In general, each component layer of components 3 is always first completely loaded in a receiver substrate 8. Only then can and should further components 3, which in particular can also have a different function, be built up in a further component layer.

The process steps of FIGS. 1*a*-1*f* thus always show only the transfer of a number of components 3 of one component layer. The process steps of FIGS. 1*a*-1*f* can then be repeated any number of times in order to build up further components layers, generally an arbitrary number.

Figure 3A:
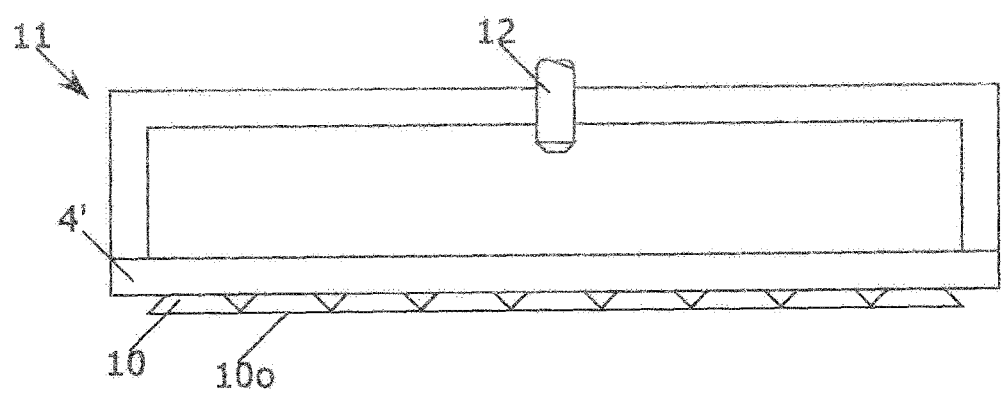
FIG. 3a shows a transfer substrate with a transfer die in a first position.
Figure 3B:
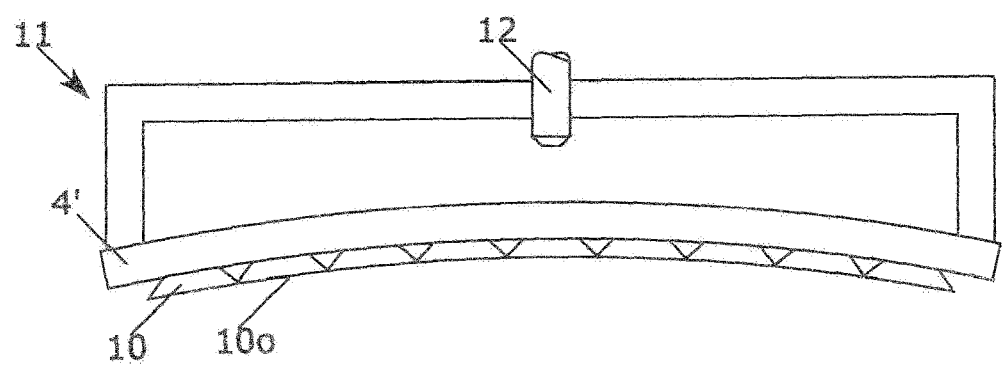
FIG. 3b shows a transfer die in a second position.
Figure 3C:
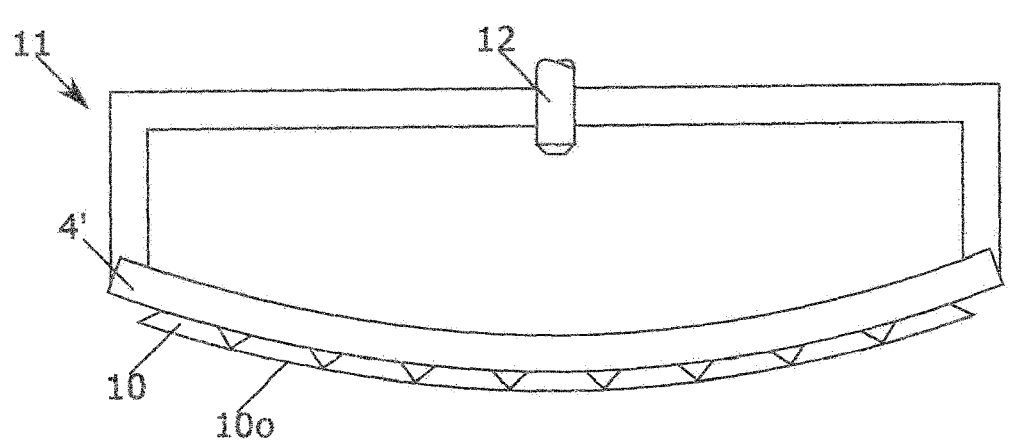
FIG. 3c shows a transfer die in a third position.

The second process is not explicitly represented by figures. It is distinguished primarily by the fact that transfer die 11 represented and described in FIGS. 3*a*-3*c* is used for the transfer of components 2. Transfer die 11 can be used together with other bonding and debonding means for the transfer of components 2. In particular, the transfer of components 2 is facilitated by the fact that fixing elements 10 of transfer substrate 4' can fix components 2, without other bonding means having to be used. The release of components 2 from fixing elements 10 of transfer substrate 4' then preferably takes place by means of a curvature of transfer substrate 4' according to one of FIGS. 3*b* and 3*c*. The debonding process from sender substrate 1 or the bonding process to receiver substrate 8 can however again take place by means of the mentioned bonding and/or debonding means (6, 7). Curveable transfer substrate 4' and/or the entire transfer die thus at the same time represent a bonding and debonding means (6, 7).

Figure 2:
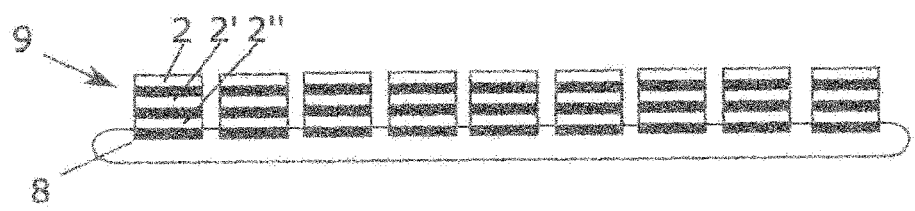
FIG. 2 shows a fully loaded receiver substrate according to the invention.

FIG. 2 shows an end product of a receiver substrate 8, on which a plurality of components groups, in particular white light LEDs 9, have been produced with the method. White light LEDs 9 comprises three different components 2, 2', 2". Each of components 2, 2', 2" is an independent single-colour LED, i.e. a light-emitting diode for a quite specific wavelength range. For example, component 2 is a red light LED (rLED), component 2' is a green light LED (gLED) and component 2" is a blue light LED (bLED). Through the combination of single-colour LEDs, white light LEDs 9 can thus be produced in a straightforward manner. Further embodiments of white light LEDs 9 are explained in the other figures and descriptions of the figures.

In the further figures, special embodiments of white light LEDs 9 are represented. These white light LEDs 9 are produced by the process. The representation of the different semiconductor areas of a diode for single-colour LEDs 2, 2', 2" is dispensed with just as the representation of contacts. The representation of white light LEDs 9 only has the purpose of showing embodiments.

FIG. 3a shows a transfer die 11 in a first position. Transfer die 11 is comprised of a transfer substrate 4', which has a plurality of fixing elements 10. Fixing elements 10 fix via the fixing element surface corresponding components 2 (not shown).

Transfer die 11 can comprise deformation elements 12, which can deform transfer substrate 4'. Deformation elements 12 can be pins, which can move in the x-y-z direction in the interior of transfer die 11, in particular by a suitable mechanical system, and are thus able to curve transfer elements 4' locally. In the present case, deformation element 12 is represented as a supply line and can convey a fluid, in particular a gas or a gas mixture, into the chamber.

FIG. 3b shows a transfer die 11 in a second position.

Deformation element 12 ensures that transfer substrates 4' can be curved in a concave shape. If deformation element 12 is a supply line, the curvature takes place in particular by evacuating the interior space.

FIG. 3c shows a transfer die 11 in a second position.

Deformation element 12 ensures that transfer substrates 4' can be curved in a convex shape. If deformation element 12 is a supply line, the curvature takes place in particular by generating an excess pressure in the interior space.

Figure 4:
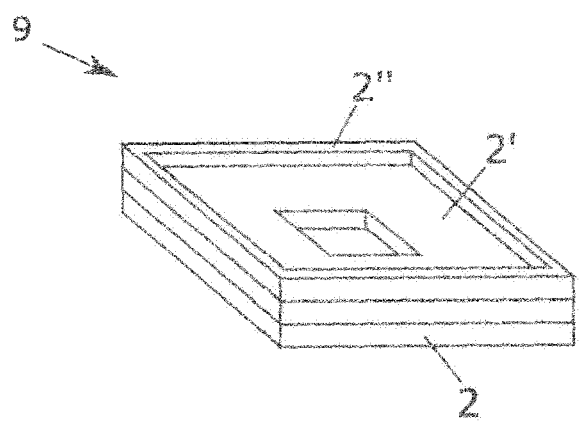
FIG. 4 shows a first white light diode (wLED) according to the invention.

FIG. 4 shows a first white light LED 9, comprising single-colour LEDs 2, 2', 2". Single-colour LEDs 2' and 2" have been produced in an annular form. Bottom LED 2 is formed over the full area. The circular openings of LEDs 2' and 2" permit the bottom LED or the bottom LEDs to emit photons. A white light LED 9 can thus be produced in a straightforward manner by the emission of photons in the three wavelength ranges for the colours red, green and blue. In particular, the process can be used in order to carry out the stacking of LEDs 2, 2', 2". The annular shape of single-colour LEDs 2, 2', 2" can be arbitrary, but is preferably rectangular, still more preferably round.

Figure 5:
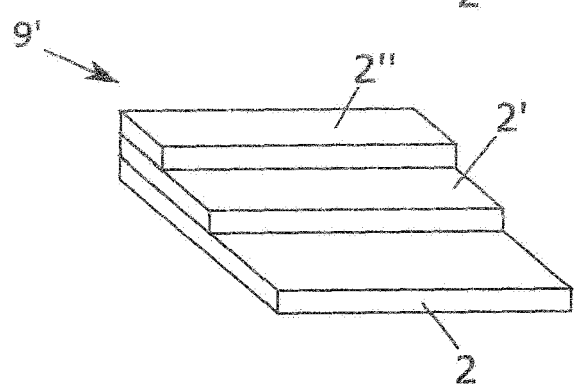
FIG. 5 shows a second white light diode (wLED) according to the invention.

FIG. 5 shows a second white light LED 9', in which the individual LEDs 2, 2', 2" differ from one another in size and relative position.

LIST OF REFERENCE NUMBERS 1 sender substrate
1o sender substrate surface
2, 2', 2" component
3 adhesive area
4, 4' transfer substrate
5 frame
6 bonding means
7 debonding means
8 receiver substrate
9 LED
10 fixing element
10o fixing elements surface
11 fixing die
12 deformation element

What is claimed is:

1. A method for the transfer of components from a sender substrate to a receiver substrate with at least the following steps:

i) provision and/or production of the components on the sender substrate,
ii) transfer of the components of the sender substrate to the transfer substrate,
iii) transfer of the components from the transfer substrate to the receiver substrate,
wherein the components can be transferred selectively by means of bonding means and/or debonding means,
wherein individual components or a plurality of components are fixed, locally limited, during the transfer in step ii) and step iii) by the bonding means by laser radiation and released, locally limited, during the transfer in step ii) and step iii) by the debonding means by laser radiation.

2. The method according to claim 1, wherein, for the selection, the components are tested at least once by an electrical test for functionality.

3. The method according to claim 1, wherein, during the transfer in step ii), the transfer substrate contacts and/or applies pressure to the components provided on the sender substrate, so that the components are kept in a specific position between the sender substrate and the transfer substrate.

4. The method according to claim 1, wherein, during the transfer in step iii), the components arranged on the transfer substrate contact and/or apply pressure to the receiver substrate, so that the components are held between the transfer substrate and the receiver substrate.

5. The method according to claim 1, wherein a release layer and/or an adhesion layer is applied respectively on the sender substrate and/or the transfer substrate and/or the receiver substrate and/or the components, which layers, through the action of the debonding means and/or the bonding means, change their adhesive properties with respect to the components in an adhesive area.

6. The method according to claim 1, wherein the sender substrate and/or the transfer substrate and/or the receiver substrate are designed permeable for the laser radiation.

7. The method according to claim 1, wherein the transfer substrate comprises fixing elements, which fix the components during the transfer by surface adhesion.

8. The method according claim 7, wherein the fixing elements are made of a polymer material and/or have a design that corresponds with a design of a suction cup.

9. The method according to claim 7, wherein the transfer substrate is deformed during the transfer by mechanical and/or pneumatic means, so that the components are released from the fixing elements and/or fixed by the fixing elements in a manner offset in terms of space and/or time.

10. The method according to claim 1, wherein the transfer substrate is an elastic film.

11. A device for the transfer of components using a method according to claim 1, wherein components can be produced and/or provided on a sender substrate,
wherein the components of the sender substrate can be transferred to a transfer substrate,
wherein the components can be transferred from the transfer substrate to the receiver substrate, and
wherein the transfer of the components to the transfer substrate and/or the receiver substrate can be carried out selectively by the bonding means and/or the debonding means.

12. A light-emitting diode (LED) produced by a method according to claim 1.

13. The light-emitting diode according to claim 12, wherein the light-emitting diode is comprised of a plurality of the components provided by different sender substrates and arranged upon one another and/or beside one another.

\* \* \* \* \*